United States Patent [19]

Davis

[11] Patent Number: 4,710,728
[45] Date of Patent: Dec. 1, 1987

[54] AMPLIFIER HAVING IMPROVED GAIN-BANDWIDTH PRODUCT

[75] Inventor: William F. Davis, Tempe, Ariz.
[73] Assignee: Motorola, Inc., Schaumburg, Ill.
[21] Appl. No.: 880,251
[22] Filed: Jun. 30, 1986
[51] Int. Cl.$^4$ .............................................. H03F 3/45
[52] U.S. Cl. .................................... 330/252; 330/257
[58] Field of Search ............... 330/252, 257, 302, 310, 330/311, 288

[56] References Cited

U.S. PATENT DOCUMENTS 4,555,670 11/1985 Tanaka ............................ 330/257 X
4,607,232 8/1986 Gill, Jr. ........................... 330/257 X

*Primary Examiner*—Eugene R. LaRoche
*Assistant Examiner*—Steven J. Mottola
*Attorney, Agent, or Firm*—Vincent B. Ingrassia

[57] ABSTRACT

An amplifier includes an input stage having first and second differentially coupled transistors for receiving a differential input signal and providing a differential output to third and fourth differentially coupled transistors in the second stage. An RC circuit cooperates with the first and second stages to produce first and second additional pole-zero pairs, one occurring before the unity gain frequency and one occurring after the unity gain frequency. A second RC circuit cooperates with the second stage and introduces a third additional pole-zero pair which occurs below the unity gain frequency. As a result, the gain bandwidth product and the phase margin proximate the unity gain frequency are enhanced.

4 Claims, 2 Drawing Figures

4,710,728

AMPLIFIER HAVING IMPROVED GAIN-BANDWIDTH PRODUCT

Cross Reference to Related Applications

This application is related to U.S. application Ser. No. 880,475 entitled AMPLIFIER HAVING IMPROVED GAIN/BANDWIDTH PRODUCT filed of even date herewith and assigned to the assignee of the present invention, the teachings of which are hereby incorporated by reference.

BACKGROUND OF THE INVENTION

This invention relates generally to operational amplifier, and more particularly to an operational amplifier having an improved gain bandwidth product.

In the case of an operational amplifier utilizing single pole compensation, the open loop gain is generally larger at low frequencies and decreases to unity at the unity gain frequency ($f_u$) at a rate of 20 db per decade. The gain bandwidth product (GBW) for such a single pole slope is the product of frequency ($f_1$) and the gain ($A_1$) at $f_1$; i.e. GBW=$A_1 f_1$. There may be applications, however, where for operation at $f_1$, a gain greater than $A_1$ is desired. Merely increasing $A_1$ would result in a corresponding increase in the unity gain frequency which in turn may cause the amplifier to be unstable in a closed loop unity gain configuration.

SUMMARY OF THE INVENTION

It is an object of the present invention to provide an improved operational amplifier.

It is a further object of the present invention to provide an improved operational amplifier having an enhanced gain bandwidth product.

It is a still further object of the present invention to provide an operational amplifier which introduces first and second additional pole-zero pairs in the input stage transfer function and a third additional pull-zero pair in the amplifier's second stage transfer function.

According to a broad aspect of the invention there is provided an amplifier circuit having a unity gain frequency, comprising an input stage including first and second differentially coupled input transistors each having base, emitter and collector terminals, the emitter terminals for coupling to a first source of supply voltage, and the base terminals being coupled to receive first and second input signals respectively. The collector terminals of the first and second input transistors form first and second outputs. A second stage includes third and fourth differentially coupled input transistors each having base, emitter and collector terminals, the emitter terminals for coupling to a source of supply voltage, and the base terminals of the third and fourth transistors being coupled to receive the first and second outputs respectively. The collector terminal of the fourth transistor forms a third output. First circuit means is coupled to the input stage and to the second stage for generating first and second pole-zero pairs ($P_A$, $Z_A$) and ($P_C$, $Z_C$). Current mirror means is coupled between the collector terminals of the third and fourth transistors and the first source of supply. Second circuit means is coupled between the collector terminal of the third transistor and the current mirror means for producing a third pole-zero pair ($P_B$, $Z_B$).

The above and other objects, features and advantages of the present invention will be more clearly understood from the following detailed description taken in conjunction with the accompanying drawings, in which:

DESCRIPTION OF THE PREFERRED EMBODIMENT

Figure 1:
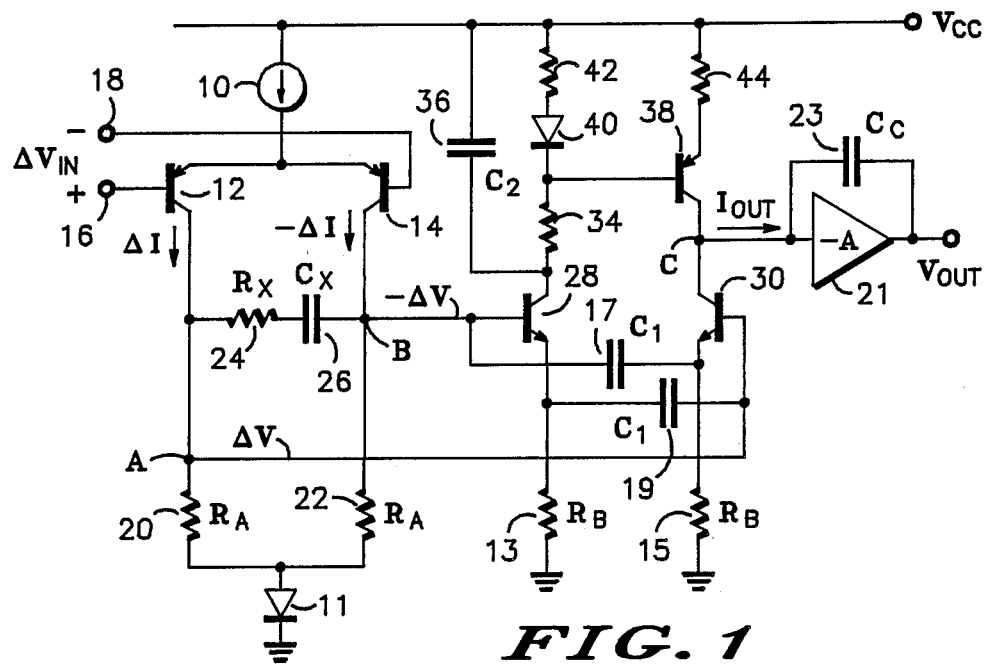
FIG. 1 is a schematic diagram of the first and second stages and the frequency compensation stage of an operational amplifier in accordance with the present invention.

FIG. 1 is a schematic diagram of the input and second stages and the frequency compensation stage of an operational amplifier. The input stage includes current source 10 coupled between a source of supply voltage $V_{cc}$ and the emitters of differential PNP input transistors 12 and 14. The base electrodes of transistors 12 and 14 are coupled respectively to input terminals 16 and 18 across which an input voltage $\Delta V_{IN}$ is provided. The collectors of input transistors 12 and 14 are coupled via load resistors 20 and 22 respectively and via diode 11 to a second source of supply voltage (e.g. ground). Coupled across the collectors of transistors 12 and 14; (i.e. across nodes A and B) is the series combination of resistor 24 and capacitor 26.

The voltages appearing at nodes A and B ($\Delta V$ and $-\Delta V$ respectively) are applied respectively to the base electrodes of PNP transistors 30 and 28 in the amplifier's second stage. The emitters of transistors 28 and 30 are coupled to the second source of supply voltage via resistors 13 and 15 respectively. The base of transistor 28 is coupled to the emitter of transistor 30 via capacitor 17, and the base of transistor 30 is coupled to the emitter of transistor 28 via capacitor 19.

The second stage also comprises resistor 34, capacitor 36, PNP transistor 38, diode 40 and resistors 42 and 44. As can be seen, the collector of transistor 28 is coupled via capacitor 36 to the first source of supply $V_{CC}$ and, via resistor 34 to the base electrode of transistor 38 and to the cathode of diode 40. The anode of diode 40 and the emitter of transistor 38 are coupled to $V_{CC}$ via resistors 42 and 44 respectively. The collector of transistor 30 is coupled to the collector of transistor 38 and forms an output node at which an output current $I_{OUT}$ is generated. The collectors of transistors 30 and 38 are also coupled to the operational amplifier's single pole compensation circuitry 21 and 23 in a well known manner which in turn generates the operational amplifier's output voltage $V_{OUT}$.

Ignoring for the time being the effects of resistors 24 and 34 and capacitors 17, 19, 26 and 36, the amplifier shown in FIG. 1 operates in the well known manner. For example, a differential input voltage ($\Delta V_{IN}$) at terminals 16 and 18 will render transistors 12 and 14 conductive to varying degrees of collector current $\Delta I$. This current may be expressed as:

$$\Delta I = (gm_I/2) \Delta V_{IN} \tag{1}$$

where $gm_I$ is the tranconductance of input transistors 12 and 14. Current $\Delta I$ interacts with load resistors 20 and 22 causing a voltage change of $\Delta V$ and $-\Delta V$ at the base electrodes of transistors 30 and 28 respectively in the second stage. Transistor 28 and 30 cooperate in the well known manner with resistors 13 and 15, and with the current mirror circuit comprised of transistor 38, diode 40 and resistors 42 and 44, to produce an output current $I_{OUT}$ at the collector node C of transistors 30 and 38. If resistors 13, 15, 20 and 22 are substantially equal, the current change in the collectors of transistors 30 and 28 reflects the current change in the collectors of transistors 12 and 14 respectively; i.e. $\Delta I$ and $-\Delta I$ respectively. In this case, $$\Delta I_{OUT} = 2\,\Delta I = gm_I \Delta V_{IN} \tag{2}$$

and the well known unity gain frequency $f_u$ is $$f_u = gm_I / 2\pi C_c \tag{3}$$

where $C_c$ is the capacitance of compensation capacitor 23. Since $f_u$ is also the gain bandwidth product measured at low frequencies, then, the gain bandwidth product is $$GBW = gm_I / 2\pi C_c \tag{4}$$

If capacitor 17 and 19 are considered to be part of the circuit, then the circuit functions in accordance with the teachings of U.S. Pat. No. 4,517,524 entitled HIGH FREQUENCY OPERATIONAL AMPLIFIER, issued on May 14, 1985, the teachings of which are hereby incorporated by reference. The $\Delta I_{OUT}/\Delta V_{IN}$ transfer function is represented by the following:

$$\frac{\Delta I_{OUT}}{\Delta V_{IN}} = \frac{gm_I R_A}{R_B} \cdot \frac{(S2R_B C_1 + 1)}{(S2R_A C_1 + 1)} \tag{5}$$

where $R_A$ is a resistance of resistors 20 and 22, $R_B$ is the resistance of resistors 13 and 15, $C_1$ is the capacitance of capacitors 17 and 19, and S is the well known LaPlace frequency dependent variable ($J\omega$). By now adding into the circuit the network of resistor 24 and capacitor 26, an interaction occurs causing the $\Delta I_{OUT}/\Delta V_{IN}$ transfer function to become:

$$\frac{\Delta I_{OUT}}{\Delta V_{IN}} = \tag{6}$$

$$K_O \frac{(S2R_B C_1 + 1)(SC_x R_x + 1)}{[S(C_x C_1)(r_e + R_x)/(C_x + C_1) + 1][S2R_A(C_x + C_1) + 1]}$$

where $K_O$ is a gain constant, $C_x$ is a capacitance of capacitor 26, $R_x$ is the resistance of resistor 24, and $r_e$ is the dynamic emitter resistance of transistors 28 and 30.

Referring now to the collector circuitry (the current mirror circuitry) of the second stage, the circuitry shown is identical to that shown and described in the above identified related application. It was demonstrated in that application that the inclusion of resistor 34 and capacitor 36 also provides an additional pole-zero pair in the output current. The pole appears at $-1/R_T C_2$ where $R_T$ is the sum of the resistance of resistors 34 and 42 and the dynamic resistance of diode 40 and $C_2$ is the capacitance of capacitor 36. A zero is produced at $-2/R_T C_2$. Thus, the circuitry shown in FIG. 1 produces the following transfer function:

$$\frac{\Delta I_{OUT}}{\Delta V_{IN}} = \tag{7}$$

$$K_1 \frac{(S2R_B C_1 + 1)(SC_x R_x + 1)(SR_T C_2 + 2)}{[S(C_x C_1)(r_e + R_x)/(C_x + C_1) + 1][S2R_A(C_x + C_1)(SR_T C_2 + 1)]}$$

where $K_1$ is a gain constant.

In addition to the well known single pole integration function of the compensation circuit 21 and 22, three pole-zero pairs ($P_A$, $Z_A$; $P_B$, $Z_B$; and $P_C$, $Z_C$) can be identified. That is, $$P_A = \tfrac{1}{2} R_A (C_x + C_1) \tag{8}$$

$$Z_A = \tfrac{1}{2} R_B C_1 \tag{9}$$

$$P_B = 1/R_T C_2 \tag{10}$$

$$Z_B = 2/R_T C_2 \tag{11}$$

$$P_c = 1/[C_x C_1/(C_x + C_1)](r_e + R_x) \tag{12}$$

$$Z_c = 1/R_x C_x \tag{13}$$

Although many pole-zero combinations are possible, the values of $R_A$, $R_B$, $R_x$, $R_T$, $C_1$, $C_2$, and $C_x$ can be chosen such that the ($P_A$, $Z_A$) pair and the ($P_B$, $Z_B$) pair are less than the designated unity gain frequency ($f_u$) of the operational amplifier and the ($P_C$, $Z_C$) pair is greater than $f_u$. Furthermore, if $R_A$ is approximately equal to $R_B$, $C_1$ is approximately equal to $C_x$, and $R_x$ is much greater than $R_B$, then $$Z_A \simeq 2P_A \tag{14}$$

$$Z_B = 2P_B \tag{15}$$

$$P_c = 2Z_c \tag{16}$$

Thus the pole-zero pairs ($P_A$, $Z_A$) and ($P_B$, $Z_B$) each have a leading pole one octave lower in frequency than its associated zero, while the ($P_c$, $Z_c$) pair has a leading zero one octave lower in frequency than its associated pole.

It is well known that a pole-zero pair wherein the pole and zero are one octave apart will produce a permanent gain change of 6 dB and a maximum recoverable phase perturbation of approximately 20 degrees. Thus, by insuring that the ($P_A$, $Z_A$) pair and the ($P_B$, $Z_B$) pair are less than the unity gain frequency, a 12 dB gain difference will exist between the unity gain frequency and frequencies lower than either of the two pole-zero pairs. This effectively enhances the gain/bandwidth product over the unity gain frequency by a factor of 4; i.e. $GBW = 4f_u$.

Since the ($P_c$, $Z_c$) pair is higher than a unity gain frequency and the $Z_c$ frequency is one octave less than the $P_c$ frequency, the positive phase of $Z_c$ exerts a greater influence at the unity gain frequency than the negative phase of the associated pole $P_c$. The net result is an improvement in the phase margin at the unity gain frequency due to the presence of the third pole-zero pair.

Figure 2:
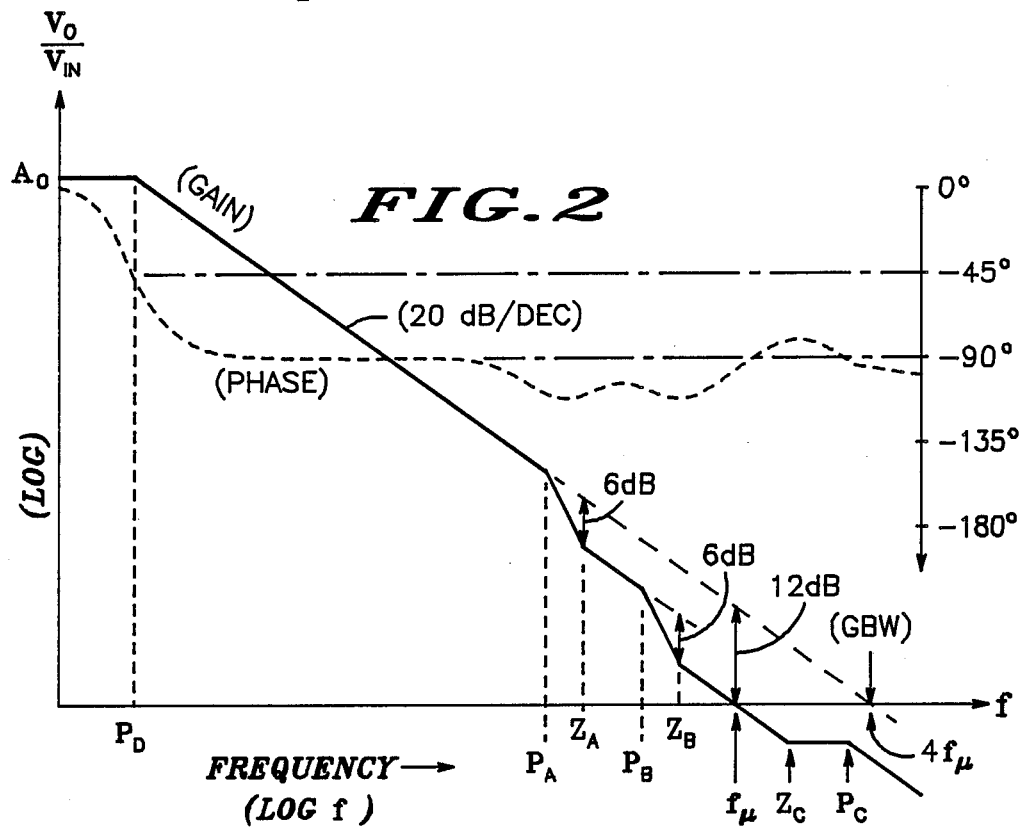
FIG. 2 is a curve illustrating the gain bandwidth product improvement of the amplifier shown in FIG. 1.

FIG. 2 is a classic Bode plot of voltage gain ($V_{OUT}/V_{IN}$) versus frequency (f) for the inventive circuit shown in FIG. 1. The open loop DC gain is $A_0$ with a dominant pole $P_D$ caused by the compensation network 21 and 23. The initial single pole response will have a gain bandwidth product as described by equation 4. For each ($P_A$, $Z_A$) and ($P_B$, $Z_B$) pole-zero pair, the gain will decrease 6 dB per pair. Thus, the gain at the unity gain frequency is 12 dB below the gain projected at lower frequencies. Thus, the actual unity gain frequency is one quarter that of the gain bandwidth product. Stated differently, the gain bandwidth product is enhanced by a factor of 4 over the actual unity gain frequency.

For each pole-zero pair below $f_u$, the maximum excess phase is approximately 20 degrees between the pole-zero midpoint. Thus, the relative location of the $(P_A, Z_A)$ pair with respect to the $(P_B, Z_B)$ pair will effect the total excess phase near the pole-zero locations. In the worst case, each pole-zero pair will be identical causing approximately 40 degrees of excess phase degradation. In the best case, each pole-zero pair is separated sufficiently to cause only 20 degrees of excess phase degradation.

The $P_C$, $Z_C$ pair above $f_u$ increases the gain by approximately 6 dB and increases the phase near $f_u$. This phase increase near $f_u$ due to $Z_C$ is significant since, in practice, secondary amplifier poles near $f_u$ will tend to be compensated by $Z_c$ which will provide an improvement in phase margin.

The above description is given by way of example only. Changes in form and details may be made by one skilled in the art without departing from the scope of the invention as defined by the appended claims.

I claim:

1. An amplifier circuit having a unity gain frequency, comprising:
    an input stage including first and second differentially coupled input transistors each having a base, emitter and collector terminals, said emitter terminals for coupling to a first source of supply voltage, and the base terminals being coupled to receive first and second input signals respectively, the collector terminals of said first and second input transistors forming first and second outputs;
    a second stage including third and fourth differentially coupled input transistors each having base, emitter and collector terminals, said emitter terminals for coupling to a source of supply voltage, and said base terminals of said third and fourth transistors being coupled to receive said first and second outputs respectively, the collector terminal of said fourth transistor forming a third output;
    first circuit means coupled to said input stage and to said second stage for generating first and second pole-zero pairs $(P_A, Z_A)$ and $(P_c, Z_c)$, said first circuit means comprising an RC series network having a first end coupled to the collector of said first input transistor and having a second end coupled to the collector of said second input transistor, a first capacitor having a first terminal coupled to the collector at said second input transistor and to the base of said third input transistor and a second terminal coupled to the emitter of said fourth input transistor, and a third capacitor having a first terminal coupled to the collector of said first input transistor and to the base of said third input transistor and a second terminal coupled to the emitter of said third input transistor;
    current mirror means for coupling between the collector terminals of said third and fourth transistors and said first source of supply; and
    second circuit means coupled between the collector terminal of said third transistor and said current mirror means for producing a third pole-zero pair $(P_B, Z_B)$.

2. An amplifier circuit according to claim 1 wherein said second circuit means comprises:
    a second resistor having a first end coupled to the collector terminal of said third input transistor and a second end coupled to said current mirror means; and
    a third capacitor having a first terminal coupled to the collector terminal of said third input transistor and a second terminal for coupling to said first source of supply voltage.

3. An amplifier circuit according to claim 2 wherein said first and third pole-zero pairs occur at frequencies below the unity gain frequency.

4. An amplifier circuit according to claim 3 wherein said second pole-zero pair occurs at frequencies above the unity gain frequency.

* * * * *